(12) United States Patent
Bien et al.

(10) Patent No.: US 7,852,253 B2
(45) Date of Patent: Dec. 14, 2010

(54) DIGITALLY ADJUSTABLE QUANTIZATION CIRCUIT

(75) Inventors: David E. Bien, Glendale, AZ (US);
Brandt Braswell, Chandler, AZ (US);
Merit Y. Hong, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 33 days.

(21) Appl. No.: 12/388,231

(22) Filed: Feb. 18, 2009

(65) Prior Publication Data

US 2010/0207797 A1    Aug. 19, 2010

(51) Int. Cl.
*H03M 1/12* (2006.01)

(52) U.S. Cl. ............... 341/155; 341/143; 341/154; 341/159; 341/200

(58) Field of Classification Search ........... 341/143, 341/159, 200
See application file for complete search history.

(56) References Cited

U.S. PATENT DOCUMENTS

| | | | | |
|---|---|---|---|---|
| 4,939,518 A | * | 7/1990 | Hotta et al. | 341/159 |
| 6,346,898 B1 | * | 2/2002 | Melanson | 341/143 |
| 7,268,715 B2 | | 9/2007 | Guimaraes | |
| 7,298,305 B2 | * | 11/2007 | Melanson | 341/143 |
| 7,298,306 B2 | * | 11/2007 | Melanson | 341/143 |
| 7,315,200 B2 | | 1/2008 | Holberg et al. | |
| 7,453,381 B2 | * | 11/2008 | Doerrer et al. | 341/143 |

* cited by examiner

*Primary Examiner*—Khai M Nguyen
(74) *Attorney, Agent, or Firm*—Ingrassia, Fisher & Lorenz, P.C.

(57) ABSTRACT

Apparatus and methods are provided for converting an analog input signal to a digital output value. A quantization circuit comprises an input node and a comparator array, wherein each comparator of the comparator array is coupled to the input node. A voltage divider arrangement is coupled to the comparator array and configured to establish a respective threshold voltage for each comparator of the comparator array. The comparator array generates a digital code based on the input signal and the respective threshold voltage for each comparator. A control node is coupled to the voltage divider arrangement, wherein the control node and the voltage divider arrangement are cooperatively configured to adjust the threshold voltage for at least one comparator of the comparator array in response to a control signal at the control node.

21 Claims, 4 Drawing Sheets

DIGITALLY ADJUSTABLE QUANTIZATION CIRCUIT

TECHNICAL FIELD

Embodiments of the subject matter described herein relate generally to mixed-signal circuits, and more particularly, embodiments of the subject matter relate to quantization circuits for analog-to-digital converters configured for multiple operating modes.

BACKGROUND

In many modern electronics applications, it is desirable to convert an analog signal to a digital value. For example, in a radio frequency (RF) transceiver, a received analog RF signal may be demodulated to an analog baseband signal which is then converted to a digital baseband signal for subsequent digital signal processing.

Many electrical systems utilize analog-to-digital converters (ADCs) to convert an analog input signal to a digital output value. However, because of the finite nature of digital representation, quantization error (which is the difference between the actual analog value and quantized digital value due to rounding or truncation) is an imperfection inherent to the analog-to-digital conversion. If the voltage resolution of the ADC is large relative to the input signal voltage, the quantization error increases and degrades the signal-to-noise ratio (SNR) of the ADC. As a result, most ADCs are designed with a voltage resolution and/or voltage range tailored for a particular input signal range (e.g., amplitude or voltage swing) to minimize the quantization error of the ADC. However, different communications standards (e.g., wideband code division multiple access (WCDMA), long term evolution (LTE), Global System for Mobile communications (GSM), and the like) often specify analog signals with different signal ranges. Most ADCs are designed to accommodate a particular communications standard, and as a result, the performance characteristics of a particular ADC may be inadequate for use with a different communications standard. For example, the voltage resolution and/or voltage range may be too large or too small for a different communications standard, thereby resulting in unacceptably high SNR for the ADC.

Rather than utilizing separate ADCs for each communications standard, some prior art systems utilize variable gain amplifiers, attenuators, and other techniques to adjust the analog input signal to a voltage level that is more compatible with voltage resolution and/or voltage range of the ADC. These systems add components to the ADC architecture, thereby increasing the size and/or current requirements for the ADC, and in some situations, negatively impact the noise performance (e.g., the SNR) of the ADC.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
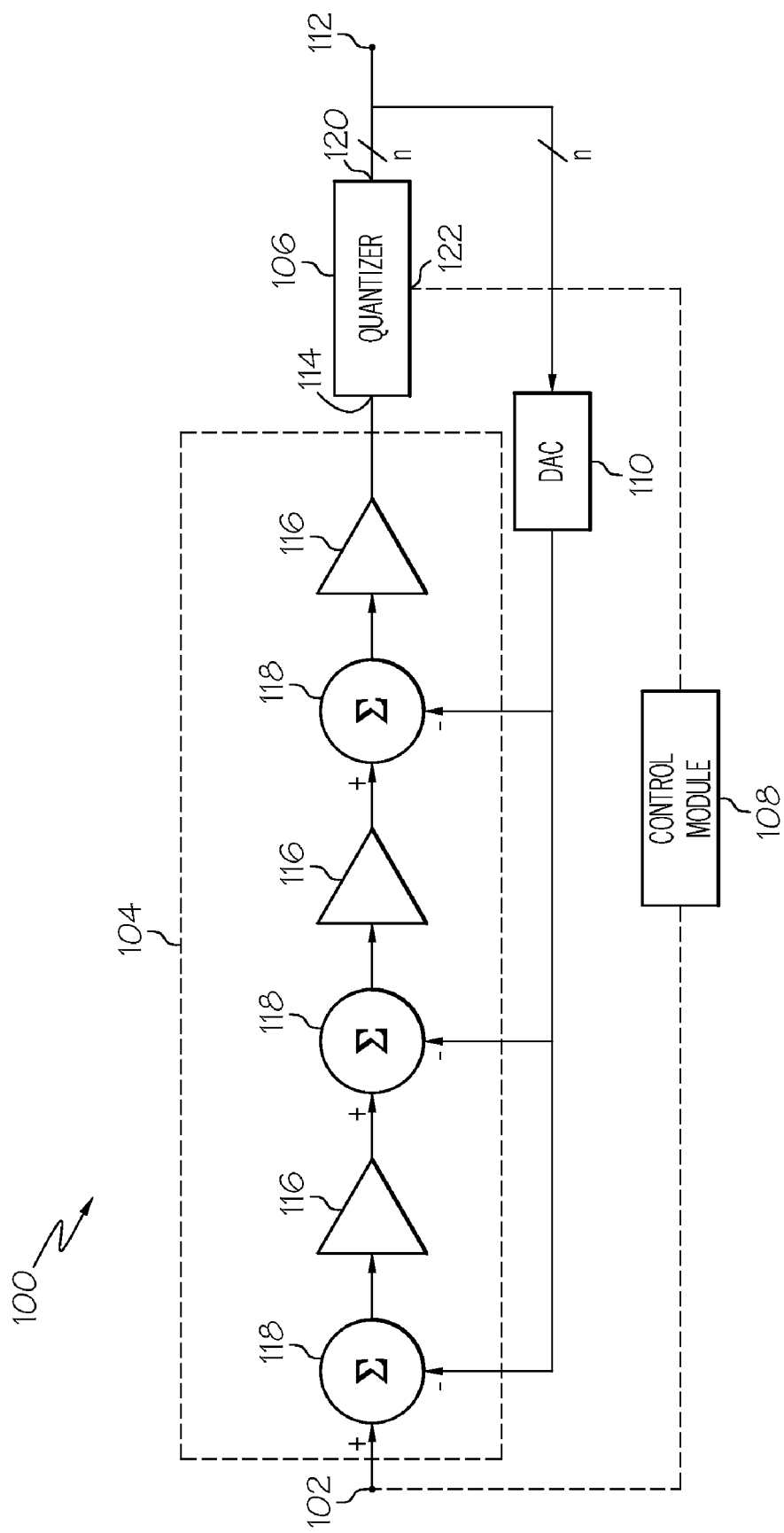
FIG. 1 is a block diagram of an analog-to-digital converter in accordance with one embodiment.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode). The following description refers to elements or nodes or features being "connected" or "coupled" together. As used herein, unless expressly stated otherwise, "connected" means that one element/node/feature is directly joined to (or directly communicates with) another element/node/feature, and not necessarily mechanically. Unless expressly stated otherwise, "coupled" means that one element is directly or indirectly joined to (or directly or indirectly communicates with) another element, and not necessarily mechanically. Thus, although the schematics shown in the figures depict exemplary arrangements of elements, additional intervening elements, devices, features, or components may be present in an embodiment of the depicted subject matter.

In addition, certain terminology may also be used in the following description for the purpose of reference only, and thus are not intended to be limiting. For example, terms such as "upper", "lower", "above", and "below" refer to directions in the drawings to which reference is made. Such terminology may include the words specifically mentioned above, derivatives thereof, and words of similar import. Similarly, the terms "first", "second" and other such numerical terms referring to structures do not imply a sequence or order unless clearly indicated by the context.

For the sake of brevity, conventional techniques related to signal processing, sampling, biasing, analog-to-digital conversion, digital-to-analog conversion, analog circuit design, differential circuit design, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter. It should be understood that circuitry described herein may be implemented either in silicon or another semiconductor material or alternatively by software code representation thereof.

Technologies and concepts discussed herein relate to systems and methods for adjusting operating characteristics (e.g., the voltage resolution and/or full scale voltage range) of a quantization circuit (or quantizer) used to convert an analog signal to a digital value. In an exemplary embodiment, the quantization circuit includes an array of comparators configured to convert an analog signal level to a thermometer code representation based on the respective threshold voltages for each comparator of the comparator array, as described in greater detail below. The quantization circuit includes a variable resistance element which is utilized to adjust the threshold voltage for one or more comparators. As a result, the voltage resolution and/or voltage range used in generating the thermometer code may be adjusted, which in turn adjusts the range of input signals resolvable by the quantization circuit and/or the resulting least significant bit step size. The quantization circuit may be used in analog-to-digital converters (ADCs) or other analog-to-digital conversion applications to support multiple operating modes. For example, an ADC may be configured for multiple operating modes, each mode being configured to support a different communications standard having different signal characteristics, such as input signal voltage range. The quantization circuit may be configured to support each communications standard, thereby allowing a single quantization circuit to be used in the ADC which maximizes reuse of components across operating modes.

FIG. 1 depicts an analog-to-digital converter 100 that is configured in accordance with an exemplary embodiment. The ADC 100 may include, without limitation, an input node 102 for receiving an analog input signal, a forward signal arrangement 104, a quantizer 106, a control module 108, a digital-to-analog converter (DAC) 110, and digital output 112. The elements of ADC 100 are suitably configured to produce a n-bit digital value at the digital output 112 that is representative of an analog input signal at the input node 102. It should be understood that FIG. 1 is a simplified diagram of the ADC 100 depicted in single-ended form, and practical embodiments of the ADC 100 may include additional or alternative components, and/or be implemented in a differential manner (e.g., a differential circuit adapted for differential input signals). Furthermore, although the ADC 100 depicted in FIG. 1 is realized using a third-order sigma-delta feedback topology, it should be understood that the subject matter described herein is not limited to a particular implementation. The subject matter may be extended to or adapted for an ADC of any order, and may apply to other ADC topologies, such as, for example, feedforward topologies, flash (or direct conversion) topologies, as well as cyclic converters including successive approximation and redundant signed digit types that use reference voltages to define conversion levels, and the like, as will be appreciated in the art.

In an exemplary embodiment, the forward signal arrangement 104 is coupled between the input node 102 and an input 114 of the quantizer 106 and establishes a forward signal path from the input node 102 to the quantizer input 114. As shown in FIG. 1, the forward signal arrangement 104 comprises a plurality of integrators 116 and a plurality of summing junctions 118 suitably configured as a third order sigma-delta feedback topology. In the illustrated embodiment, the forward signal arrangement 104 produces an analog signal at the input 114 of the quantizer 106 based on the input signal at the input node 102 and a feedback signal provided from the output of the DAC 110.

In an exemplary embodiment, the quantizer 106 generates a digital output value comprising n bits at its output 120 based on the analog signal (or analog voltage level) at its input 114. As described in greater detail below, in an exemplary embodiment, the quantizer 106 includes one or more comparators configured to generate a digital code representation of the analog signal at is input 114. In an exemplary embodiment, the quantizer 106 comprises a plurality of comparators configured to generate a thermometer code representation of the analog signal at the input 114. In this regard, the thermometer code is a base one code, wherein the number of bits in the thermometer code that are logical '1' is directly proportional to the analog signal. In accordance with one embodiment, the thermometer code may then be used to generate an n-bit digital value encoded using a different numerical base system (e.g., a binary or base two digital value) at the output 120 of the quantizer 106. The output 120 of the quantizer 106 is coupled to the digital output 112 and provides the n-bit digital value to the digital output 112. The DAC 110 is coupled between the digital output 112 (or quantizer output 120) and the summing junctions 118 of the forward signal arrangement 104 to create a closed-loop feedback path. In this regard, the DAC 110 converts the n-bit digital value to an analog feedback signal, wherein the forward signal arrangement 104 generates the analog signal at the input 114 of the quantizer 106 based on the input signal at the input node 102 and the analog feedback signal, as will be appreciated in the art. It should be understood that although FIG. 1 depicts a feedback path comprising a single DAC 110, in practice, multiple DACs may be utilized in the feedback path of the ADC 100, as will be appreciated in the art. In an exemplary embodiment, the control module 108 is coupled to the input node 102 and to a control input 122 of the quantizer 106. In accordance with one embodiment, the control module 108 is configured to adjust the voltage resolution and/or voltage range of the quantizer 106 and perform additional processes, tasks, and functions as described in greater detail below.

Figure 2:
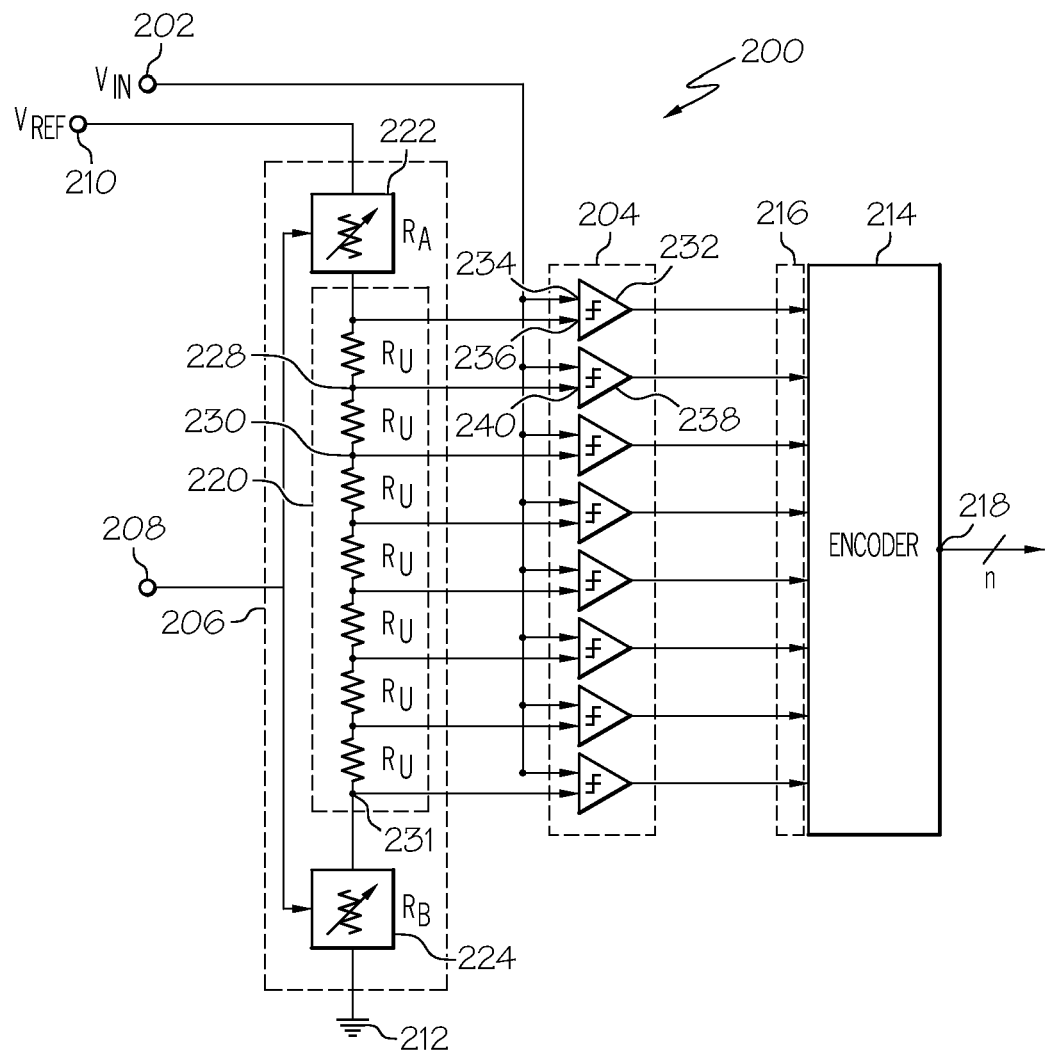
FIG. 2 is a schematic view of a quantization circuit suitable for use in the analog-to-digital converter of FIG. 1 in accordance with one embodiment.

Referring now to FIG. 2, a quantization circuit 200 suitable for use in the quantizer 106 of FIG. 1 is illustrated. It should be understood that FIG. 2 is a simplified representation of the quantization circuit 200 in single-ended form for purposes of explanation. This embodiment of quantization circuit 200 includes, without limitation, an input node 202, a comparator array 204, a threshold voltage divider arrangement 206, a control node 208, a first reference node 210, a second reference node 212, and an encoder 214. In an exemplary embodiment, the quantization circuit 200 converts an analog input signal (or analog voltage level) at the input node 202 to a n-bit digital output value (or another suitable digital representation) at the output 218 of the encoder 214. In this regard, for an n-bit binary representation of the input signal, the comparator array 204 comprises $2^n$ comparators and the threshold voltage divider arrangement 206 is configured to establish $2^n$ different threshold voltages for the comparator array 204, as described in greater detail below. Although not a requirement, FIG. 2 illustrates a quantization circuit 200 suitable for use in a 3-bit binary output value (e.g., n=3). Notably, practical embodiments of the quantization circuit 200 may include additional or alternative components, and/or be implemented in a differential manner, as will be appreciated in the art. Thus, although FIG. 2 illustrates a quantization circuit 200 configured for n=3 (e.g., eight total comparators of the comparator array 204 and eight reference nodes in the threshold voltage divider arrangement 206), it will be appreciated in the art that the quantization circuit 200 may be adapted for any value of n, and the quantization circuit 200 may be adapted for digital representation of the input signal using any suitable numerical system or base (e.g., hexadecimal and the like). Furthermore, although FIG. 2 depicts $2^n$ comparators for purposes of illustration and explanation, it should be noted that in practice, only $2^{n-1}$ comparators and/or threshold voltages are needed to provide $2^n$ quantization levels for n-bit binary representation, as will be appreciated in the art.

In the illustrated embodiment, the comparator array 204 comprises a plurality of comparators, wherein each comparator of the comparator array 204 has a non-inverting input that is coupled to the input node 202 and an inverting input coupled to the threshold voltage divider arrangement 206. For example, as shown, a first comparator 232 has a non-inverting input 234 connected to the input node 202 and an inverting input coupled to a first node 226 of the threshold voltage divider arrangement 206. In practice, the comparator array 204 may comprise any number of comparators. It will be appreciated in the art that for a differential implementation, an array of preamplifiers may be coupled between the comparators of the comparator array 204 and the threshold voltage divider arrangement 206, as described below in the context of FIG. 4.

In an exemplary embodiment, the threshold voltage divider arrangement 206 is coupled between the first reference node 210 and the second reference node 212. In an exemplary embodiment, the first reference node 210 is coupled to or otherwise configured to establish a positive reference voltage ($V_{REF}$) and the second reference node 212 is coupled to or otherwise configured to establish a ground reference voltage. The threshold voltage divider arrangement 206 is configured to establish a respective threshold voltage at the inverting input of each comparator of the comparator array 204. During operation of the quantization circuit 200, by virtue of the input node 202 being coupled to the non-inverting input of each comparator of the comparator array 204, an input signal ($V_{IN}$) at the input node 202 that exceeds the threshold voltage for a respective comparator of the comparator array 204 causes the respective comparator to generate a high output (e.g., logical '1') in response to the input signal ($V_{IN}$). In this manner, the comparator array 204 generates or otherwise converts the analog input signal ($V_{IN}$) at the input node 202 into a thermometer code representation based on the respective threshold voltages for each comparator of the comparator array 204. In other words, the comparator array 204 generates a base one digital representation of the analog input signal, wherein each comparator of the comparator array 204 corresponds to a bit of the thermometer code. As described in greater detail below, in an exemplary embodiment, the quantization circuit 200 is configured such that a control signal at the control node 208 adjusts a threshold voltage for at least one comparator of the comparator array 204, thereby adjusting the voltage resolution and/or voltage range used in generating the thermometer code. In the illustrated embodiment, The output of the comparator array 204 is coupled to the input 216 of the encoder 214 which is configured to generate a digital output value at the output 218 of the encoder 214 based on the thermometer code, as will be appreciated in the art. In this embodiment, the encoder 214 generates a n-bit binary digital output value based on the thermometer code comprising $2^n$ bits. Depending on the embodiment, the quantization circuit 200 may also include additional elements and/or components suitably configured to store the digital output value. For example, a latch and/or flip-flops may be coupled to the output 218 of the encoder 214 and suitably configured to support operation of the quantization circuit 200, as will be appreciated in the art.

In an exemplary embodiment, the threshold voltage divider arrangement 206 is coupled to the control node 208, and the threshold voltage divider arrangement 206 is configured to adjust the threshold voltage for at least one comparator of the comparator array 204 in response to a control signal at the control node 208, as described in greater detail below. In an exemplary embodiment, the threshold voltage divider arrangement 206 comprises a voltage divider 220, a first variable resistance element 222, and a second variable resistance element 224. In the illustrated embodiment of FIG. 2, the first variable resistance element 222 is coupled between the first reference node 210 and the voltage divider 220, such that the first variable resistance element 222 and the voltage divider 220 are electrically in series. In a similar manner, the second variable resistance element 224 is coupled between the second reference node 212 and the voltage divider 220, such that the second variable resistance element 224 and the voltage divider 220 are electrically in series. In an exemplary embodiment, the variable resistance elements 222, 224 are each coupled to the control node 208, and the effective resistance of the variable resistance elements 222, 224 is adjusted in response to the control signal at the control node 208 (thereby adjusting the threshold voltage(s) for one or more comparators of the comparator array 204), as described in greater detail below. It should be understood that although FIG. 2 depicts a threshold voltage divider arrangement 206 comprising two variable resistance elements 222, 224 for purposes of symmetry and component matching, in practice, the threshold voltage divider arrangement 206 may be implemented using a single variable resistance element for a single-ended implementation where the low value of the input range is at the ground potential. In this regard, it should be understood that for a differential implementation, the voltage divider arrangement may comprise two threshold voltage divider arrangements and four variable resistance elements.

In order to support n-bit binary operation of the quantization circuit 200, the voltage divider 220 is configured to provide $2^n$ threshold voltage references (or threshold voltage reference nodes) for the comparator array 204. The voltage divider 220 is preferably configured such that the effective resistance between the threshold voltage reference nodes is substantially equal (e.g., within practical and/or realistic operating tolerances), that is, the voltage difference between adjacent nodes of the voltage divider 220 is the substantially equal throughout the voltage divider 220. For example, the voltage difference between a first node 226 and a second node 228 of the voltage divider 220 is substantially equal to the voltage difference between the second node 228 and a third node 230 of the voltage divider 220. As shown in FIG. 2, in an exemplary embodiment, the voltage divider 220 is realized as a plurality of resistors (or other suitable resistance elements) configured electrically in series. In this manner, the voltage drop across each resistor in the voltage divider 220 causes each successive node (e.g., successive in the downward direction) of the voltage divider 220 to have a lower voltage (referenced from ground reference node 212) than the preceding node (e.g., the adjacent node in the upward direction). In an exemplary embodiment, each resistor of the voltage divider 220 represents a unit resistor, that is, the performance characteristics of each resistor are matched such that each resistor of the voltage divider 220 has substantially the same resistance (within practical and/or realistic operating tolerances). As shown in FIG. 2, each node of the voltage divider 220 is connected to the inverting input of a respective comparator of the comparator array 204. For example, as shown in FIG. 2, the first node 226 is connected to the inverting input 236 of the first comparator 232, the second node 228 is connected to the inverting input 240 of a second comparator 238. In this manner, the threshold voltage for generating a high (or floating)

output in response to the input signal ($V_{IN}$) is higher for the first comparator 232 than the second comparator 234 and so on.

In an exemplary embodiment, the variable resistance elements 222, 224 are each realized as a switched resistance network, although, in alternative embodiments, the variable resistance elements 222, 224 may be realized as signal-controlled resistance elements, such as, for example, variable resistors or potentiometers, an arrangement of one or more MOS devices operating in linear mode, or another suitable element having a signal-controlled resistance value. In addition, in some alternative embodiments, the variable resistance elements 222, 224 may be realized as a switched resistor DAC, a digitally-controlled voltage source configured with a resistor in series, or a resistor switched between multiple voltage values.

Figure 3:
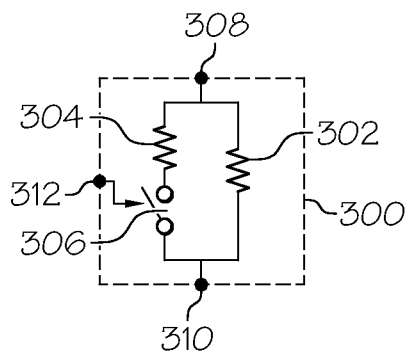
FIG. 3 is a schematic view of a switched resistance network suitable for use in the quantization circuit of FIG. 2 in accordance with one embodiment.

Referring now to FIG. 3, a switched resistance network 300 suitable for use as a variable resistance element 222, 224 in the quantization circuit 200 includes, without limitation, a first resistance element 302, a second resistance element 304, and a switch 306. The first resistance element 302 is connected electrically in series between a first node 308 and a second node 310. The second resistance element 304 and the switch 306 are configured electrically in series between the first node 308 and the second node 310. As shown, the switch 306 is connected between the second node 310 and the second resistance element 304 which, in turn, is connected to the first node 308. In this regard, the first resistance 302 and the second resistance element 304 are configured electrically in parallel when the switch 306 is closed. A control node 312 is coupled to the switch 306 such that the switch may be closed in response to a control signal at the control node 312, as described in greater detail below.

In an exemplary embodiment, the first resistance element 302 is preferably realized as one or more resistors (or other suitable resistance elements) suitably configured to provide a first resistance ($R_1$) equal to a desired effective resistance for the switched resistance network 300 when the switch 306 is open (the open state of switch 306 corresponds to a first operating mode for the switched resistance network 300). The second resistance element 304 is preferably realized as one or more resistors (or other suitable resistance elements) suitably configured to provide a second resistance ($R_2$), such that the effective resistance of the switched resistance network 300 is equal to a second desired effective resistance when the switch 306 is closed (the closed state of switch 306 corresponds to a second operating mode). In this regard, the second desired effective resistance is equal to the parallel combination of resistance elements 302, 304. It should be understood that although FIG. 3 depicts a switched resistance network 300 configured for two effective resistances (or operating modes), the switched resistance network 300 may be adapted for any number of effective resistances (or operating modes), for example, by adding additional combinations of switches and/or resistance elements. The switch 306 is preferably realized as a metal-oxide-semiconductor field-effect transistor (e.g., MOSFET), although in alternative embodiments, the switch 306 may be realized using another suitable transistor, such as a bipolar transistor device, or a suitable electromechanical device, such as a relay. In the illustrated embodiment, the gate terminal of the switch 306 is coupled to the control node 312, such that the control signal at the control node 312 activates (i.e., opens and/or closes) the switch 306, thereby changing the effective resistance (or operating mode) of the switched resistance network 300, as described in greater detail below.

Referring again to FIG. 2, and with continued reference to FIG. 3, in an exemplary embodiment, the first variable resistance element 222 is realized as a switched resistance network coupled between the first reference node 210 and the voltage divider 220 (e.g., node 226) and the second variable resistance element 224 is realized as a switched resistance network coupled between the voltage divider 220 (e.g., node 231) and the second reference node 212. In accordance with one embodiment, the threshold voltage divider arrangement 206 is realized in a complementary and symmetrical manner (e.g., a CMOS design), wherein the first variable resistance element 222 is realized using a p-type MOSFET and the second variable resistance element 224 is realized using a n-type MOSFET. In this regard, for the first resistance element 222, the switch 306 is realized as a PMOS transistor having its source terminal connected to node 310 (which is connected to the first reference node 210) and its drain terminal connected to the second resistance element 304 (which is connected to the node 226, 308). For the second resistance element 224, the switch 306 is realized as a NMOS transistor having its source terminal connected to node 310 (which is connected to the second reference node 212) and its drain terminal connected to the second resistance element 304 (which is connected to the node 231, 308). In this regard, to operate the variable resistance elements 222, 224 simultaneously with the same control signal at the control node 208, an inverter (or NOT logic gate) may be connected between the control node 208 and the control input of the first variable resistance element 222 (e.g., control node 312 which may be connected to the gate terminal of the PMOS switch 306) such that the control signal activates (i.e., opens or closes) the switches in both variable resistance elements 222, 224.

Figure 4:
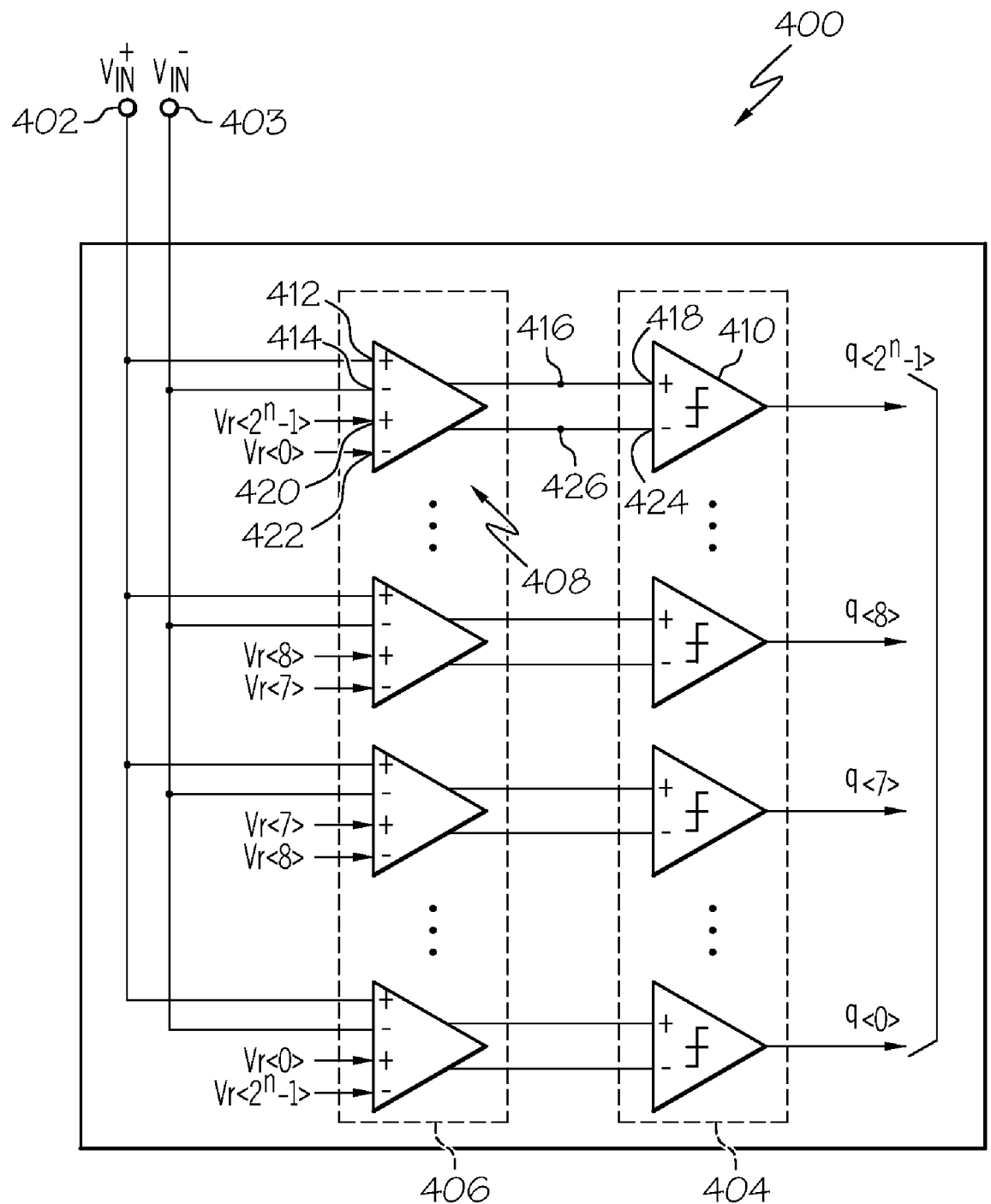
FIG. 4 is a schematic view of a comparator array suitable for use in a differential implementation of a quantization circuit in accordance with one embodiment.

FIG. 4 depicts a comparator array 400 suitable for a differential implementation of a quantization circuit (e.g., quantization circuit 200). The comparator array 400 includes, without limitation, a first input node 402 for a first input signal ($V_{IN}^+$), a second input node 403 for a second input signal ($V_{IN}^-$), a plurality of comparators 404, and a plurality of differential preamplifiers 406, wherein the differential preamplifiers 406 preferably have direct current (DC) voltage level shifting capabilities. The operation of the comparator array 400 is similar to the comparator array 204 found in the quantization circuit 200 described above with reference to FIG. 2, and will not be redundantly described in detail here in the context of the comparator array 400. Furthermore, various implementation aspects of differential circuits are well known, and as such, will not be described in detail herein.

As shown, the comparator array 400 is configured for n-bit binary operation and comprises $2^n$ comparators 404 and $2^n$ differential preamplifiers 406. A first input (e.g., the first non-inverting or plus input) of each preamplifier is connected to the first input node 402 and a second input (e.g., the first inverting or minus input) of each preamplifier is connected to the second input node 403. A third input (e.g., the second non-inverting or plus input) and a fourth input (e.g., the second inverting or minus input) of each preamplifier is connected to a particular reference node of the voltage divider (e.g., voltage divider 220) to establish a threshold reference voltage for the comparator associated with the particular preamplifier. For example, as shown, the comparator array 400 has thermometer code output bits ranging from $q\langle 0 \rangle$ to $q\langle 2^n-1 \rangle$ with $q\langle 0 \rangle$ being the least significant bit. A first preamplifier 408 and a first comparator 410 are associated with bit $q\langle 2^n-1 \rangle$, the most significant bit. The first non-inverting input 412 of the preamplifier 408 is connected to the first input node 402 and the first inverting input 414 of the preamplifier 408 is connected to the second input node 403, such that the preamplifier 408 provides the amplified difference between the input signals ($V_{IN}^+$ and $V_{IN}^-$) at a first output node 416 coupled to the non-inverting input 418 of the comparator 410. For the most significant bit, the second non-inverting input 420 of the preamplifier 408 is connected to the most positive threshold voltage reference node of the voltage divider (e.g., node 226) and the second inverting input 422 of the preamplifier 408 is connected to the least positive threshold voltage reference node of the voltage divider (e.g., node 231). The preamplifier 408 amplifies the differential input signal at input nodes 402, 403 and applies (or adds) a DC voltage level to the amplified differential input signal based on the voltage difference across inputs 420, 422, such that the differential output 416, 426 cross zero when the voltage difference between the input nodes 402, 403 crosses the applied DC voltage level. For the second most significant thermometer code bit, the second non-inverting input of the corresponding preamplifier is connected to the second highest threshold voltage reference node and the second inverting input of the corresponding preamplifier is connected to the second least positive threshold voltage reference node of the voltage divider, and so on, as will be appreciated in the art.

Referring now to FIGS. 1-4, in an exemplary embodiment, the quantizer 106 and/or quantization circuit 200 is configured to enable multiple operating modes by adjusting (e.g., increasing and/or decreasing) the effective resistance of the variable resistance elements 222, 224 to implement a desired voltage resolution and/or full scale voltage range for the particular operating mode. As used herein, voltage resolution should be understood as referring to the difference in value of the input signal at the input node 102, 202 (or input node 102) that is equivalent to a change in the least significant bit at the output 120, 218. In other words, in an exemplary embodiment where the effective resistances between nodes of the voltage divider 220 are identical, for a single-ended implementation, the voltage resolution is equal to the voltage potential difference between successive nodes of the voltage divider 220 (e.g., the voltage difference between node 226 and node 228). For a differential implementation, the voltage resolution is equal to twice the voltage potential difference between successive nodes of the voltage divider, as will be appreciated in the art. As used herein, full scale voltage range should be understood as referring to the difference between the maximum and minimum values of the input signal at the input (or input node) that are resolvable by the quantizer 106 and/or quantization circuit 200. For example, for the single-ended implementation shown in FIG. 2, the voltage range of the quantization circuit 200 is equal to the voltage potential difference between the upper and lower nodes 226, 231 of the voltage divider 220, or alternatively, the resolution of the quantization circuit 200 multiplied by the number of output bits (n).

In accordance with one embodiment, for a first mode of operation, the control signal at the control input 122 (or control node 208, 312) may be a logical '0' (e.g., a voltage less than the threshold voltage for the switch 306 in the switched resistance network 300), such that the switches of the variable resistance elements 222, 224 are open. In this manner, for the first operating mode, the effective resistance of each respective variable resistance element 222, 224 is equal to the resistance of the respective resistance element 302 ($R_1$) connected between a reference node 210, 212 and the voltage divider 220. For a second mode of operation, the control signal at the control input 122 (or control node 208, 312) may be a logical '1' (e.g., a voltage greater than the threshold voltage for the switch 306 in the switched resistance network 300), such that the switches of the variable resistance elements 222, 224 are closed. In this manner, the effective resistance of each respective variable resistance element 222, 224 is reduced by virtue of the parallel configuration of resistance elements 302, 304, as will be appreciated in the art. By decreasing (or reducing) the effective resistances of the variable resistance elements 222, 224, the threshold voltages for the comparator array 204 adjusted in a manner that increases the voltage resolution and full scale voltage range of the quantizer 106 and/or quantization circuit 200 relative to the first operating mode, as described in greater detail below.

Still referring to FIGS. 1-4, in an exemplary embodiment, the threshold voltage divider arrangement 206 is configured to establish a first voltage resolution and/or range for the quantization circuit 200 for a first operating mode and a second voltage resolution and/or range for the quantization circuit 200 for a second operating mode. For example, a first operating mode of the quantizer and/or quantization circuit may be configured to support wideband code division multiple access (WCDMA) operation having an input signal voltage range ($V_{FS}$) of 0.9 volts and a second operating mode of the quantizer and/or quantization circuit configured to support long term evolution (LTE) operation with an input signal voltage range of 1.0 volts. For a single-ended implementation such as that shown in FIG. 2, the desired effective resistance for the first variable resistance element 222 may be calculated using the equation $$R_A = R_u \cdot \left[ \frac{2^n}{V_{FS}} \cdot \left( V_{REF} - V_{MID} + \frac{V_{FS}}{2} \right) - 2^n + \frac{1}{2} \right],$$

where $R_u$ is the effective resistance between nodes of the resistor ladder (i.e., the resistance of the unit resistors), n is the number of binary output bits for the quantization circuit, $V_{FS}$ is the full-scale input signal voltage range for the particular operating mode, $V_{REF}$ is the voltage difference between reference nodes, and $V_{MID}$ is the voltage that the input signal is centered on. The desired effective resistance for the second variable resistance element 224 may be calculated using the equation $$R_B = R_u \cdot \left[ \frac{2^n}{V_{FS}} \cdot \left( V_{MID} - \frac{V_{FS}}{2} \right) + \frac{1}{2} \right].$$

For a differential implementation with a comparator array configuration such as that shown in FIG. 4, the desired effective resistance for the first variable resistance element 222 may be calculated using the equation $$R_A = R_u \cdot \left[ \frac{2^{n+1}}{V_{FS}} \cdot \left( V_{REF} - V_{MID} + \frac{V_{FS}}{4} \right) - 2^n + \frac{1}{2} \right]$$

and the desired effective resistance for the second variable resistance element 224 may be calculated using the equation $$R_B = R_u \cdot \left[ \frac{2^{n+1}}{V_{FS}} \cdot \left( V_{MID} - \frac{V_{FS}}{4} \right) + \frac{1}{2} \right].$$

It should be noted that the above equations for calculating the effective resistances for variable resistance elements 222, 224 are adapted to provide a one half least significant bit threshold voltage shift (or offset), such that the average quantization error is zero across the input signal range, as will be appreciated in the art.

For example, assuming a differential implementation of a quantizer and/or quantization circuit configured for n=4 output bits with unit resistors of $R_u=100\Omega$, $V_{REF}=1.5V$, and $V_{MID}=0.75V$, the desired effective resistance of the variable resistance elements 222, 224 is approximately $1920\Omega$ for the first operating mode (e.g., WCDMA mode with $V_{FS}=0.9V$) and approximately $1650\Omega$ for the second operating mode (e.g., LTE mode with $V_{FS}=1.0V$). Thus, the resistance elements 302, 304 of each variable resistance element 222, 224 may be suitably configured to provide a first effective resistance of $1920\Omega$ in the first operating mode (e.g., when the switch 306 is open) and a second effective resistance of $1650\Omega$ in the second operating mode (e.g., when the switch 306 is closed).

Referring again to FIG. 1, with continued reference to FIGS. 2-4, in an exemplary embodiment, the control module 108 represents the hardware, software, and/or firmware components of the analog-to-digital converter 100 which are configured to adjust the voltage resolution and/or range of the quantizer 106 by providing a control signal at the control input 122 (e.g., control node 208) of the quantizer 106. Depending on embodiment, the control module 108 may be realized as a general purpose processor, a digital signal processor, an application specific integrated circuit, a field programmable gate array, any suitable programmable logic device, discrete gate or transistor logic, discrete hardware components, or any combination thereof, designed to perform the functions described herein.

In an exemplary embodiment, the control module 108 identifies or determines a desired operating mode of the plurality of operating modes and provides a control signal indicative of the desired operating mode to the control input 122 (e.g., control node 208). In this regard, the control module 108 may determine the desired operating mode based upon one or more characteristics of the analog input signal at the input node 102 of the analog-to-digital converter 100. In accordance with one embodiment, the control module 108 may determine or identify the desired operating mode based on the frequency, amplitude, signal strength, or communications standard for the input signal at the input node 102. For example, using values from the exemplary case described above, if the control module 108 identifies or otherwise determines the presence of a WCDMA signal at the input node 102, may identify a first operating mode and provide a logical '0' to the control input 122 (e.g., control node 208) to select the first operating mode. In response to the control signal at the control node 208 identifying the first operating mode, the effective resistance of the variable resistance elements 222, 224 is adjusted (e.g., by opening the switch 306) such that the effective resistance of each variable resistance element 222, 224 is $1920\Omega$. The quantization circuit 200 generates a 16-bit (e.g., for n=4) thermometer code based on the analog input signal at the input node 202 using a voltage resolution of 0.05625 volts, that is, the least significant bit of the 4-bit binary output value of the quantizer 106 and/or quantization circuit 200 corresponds to an analog input signal at the input node 102, 202 of at least 0.05625 volts. The full scale voltage range of the quantizer 106 and/or quantization circuit 200 is 0.9 volts, thereby accommodating the full input signal voltage range for the first operating mode.

Continuing this example, during operation of the analog-to-digital converter 100, if the control module 108 identifies or otherwise determines the presence of a LTE signal at the input node 102, the control module 108, may identify a second operating mode and provide a logical '1' to the control input 122 (e.g., control node 208) to select the first operating mode. In response to the control signal at the control node 208 identifying the first operating mode, the effective resistance of the variable resistance elements 222, 224 is adjusted (e.g., by closing the switch 306) such that the effective resistance of each variable resistance element 222, 224 is $1650\Omega$. By decreasing the effective resistance of the variable resistance elements 222, 224, the quantization circuit 200 generates a 16-bit thermometer code based on the analog input signal at the input node 202 using a voltage resolution of 0.0625 volts, that is, the least significant bit of the 4-bit binary output value of the quantizer 106 and/or quantization circuit 200 corresponds to an analog input signal at the input node 102, 202 of at least 0.0625 volts. The full scale voltage range of the quantizer 106 and/or quantization circuit 200 is 0.9 volts, thereby accommodating the full input signal voltage range for the second operating mode.

It will be appreciated in the art that although the quantizer 106 and/or quantization circuit 200 is described herein in the context of only two operating modes, the quantizer 106 and/or quantization circuit 200 can be configured for additional modes of operation. In this regard, to increase the voltage resolution and/or range, the quantizer 106 and/or quantization circuit 200 may be configured to decrease the effective resistance of the variable resistance elements 222, 224 for another operating mode. Conversely, to decrease the voltage resolution and/or range, the quantizer 106 and/or quantization circuit 200 may be configured to increase the effective resistance of the variable resistance elements 222, 224 for another operating mode.

Figure 5:
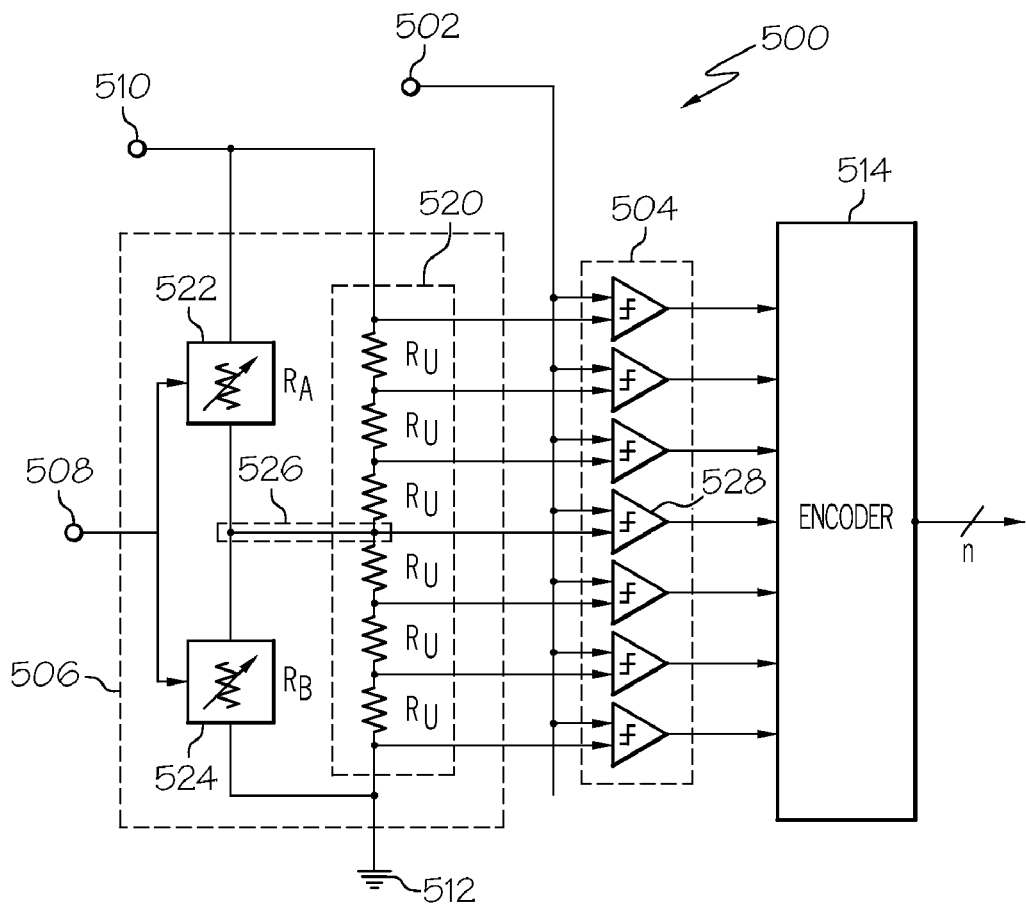
FIG. 5 is a schematic view of a quantization circuit suitable for use in the analog-to-digital converter of FIG. 1 in accordance with one embodiment.

FIG. 5 depicts a quantization circuit 500 suitable for use in the quantizer 106 of FIG. 1 in accordance with another embodiment. The quantization circuit 500 includes, without limitation, an input node 502, a comparator array 504, a threshold voltage arrangement 506, a control node 508, a first reference node 510, a second reference node 512, and an encoder 514. In an exemplary embodiment, the quantization circuit 500 converts an analog input signal (or analog voltage level) at the input node 502 to a n-bit digital representation at the output of the encoder 514 in a similar manner as described above in the context of FIG. 2. In this regard, the elements of the quantization circuit 500 are similar to their counterpart elements found in the quantization circuit 200 described above with reference to FIG. 2, and these common elements will not be redundantly described in detail here in the context of the quantization circuit 500.

As shown for this exemplary embodiment, the threshold voltage arrangement 506 comprises a first variable resistance element 522 is connected between the first reference node 510 and a node 526 of the voltage divider 520, such that the first variable resistance element 522 and the elements of the voltage divider 520 connected between the first reference node 510 and node 526 are electrically in parallel. In a similar manner, a second variable resistance element 524 is coupled between the second reference node 512 and the node 526 of the voltage divider 520, such that the second variable resistance element 524 and the elements of the voltage divider 520 connected between the second reference node 512 and node 526 are electrically in parallel. It should be understood that although FIG. 5 depicts node 526 as being near the midpoint of the voltage divider 520, node 526 could be at any point on the voltage divider 520, and the subject matter is not intended to be limited to a particular node of the voltage divider 520.

In an exemplary embodiment, the variable resistance elements 522, 524 are each coupled to the control node 508 such that the effective resistance of the variable resistance elements 222, 224 is adjusted in response to the control signal at the control node 508. As shown, the node 526 of the voltage divider 520 is also connected to an inverting input of a comparator 528 of the comparator array 504, such that the node 526 establishes the threshold voltage for the comparator 528. By adjusting (e.g., increasing and/or decreasing) the effective resistance of the variable resistance elements 522, 524, the threshold voltage of the comparator 528 may be adjusted. Adjusting the voltage at node 526 also changes or adjusts the voltage across the voltage divider 520 (e.g., between nodes 510 and 526 and/or between nodes 512 and 526), which adjusts the threshold voltage for one or more additional comparators (e.g., comparators other than comparator 528) of the comparator array 504. In this regard, in practice, depending on the needs of a particular application, additional resistance elements or resistors may be configured electrically in series between a reference node 510, 512 and the voltage divider 520 to allow the upper and/or lower threshold voltages for the comparator array 504 to be a voltage other than the reference voltage at a particular reference node 510, 512.

Figure 6:
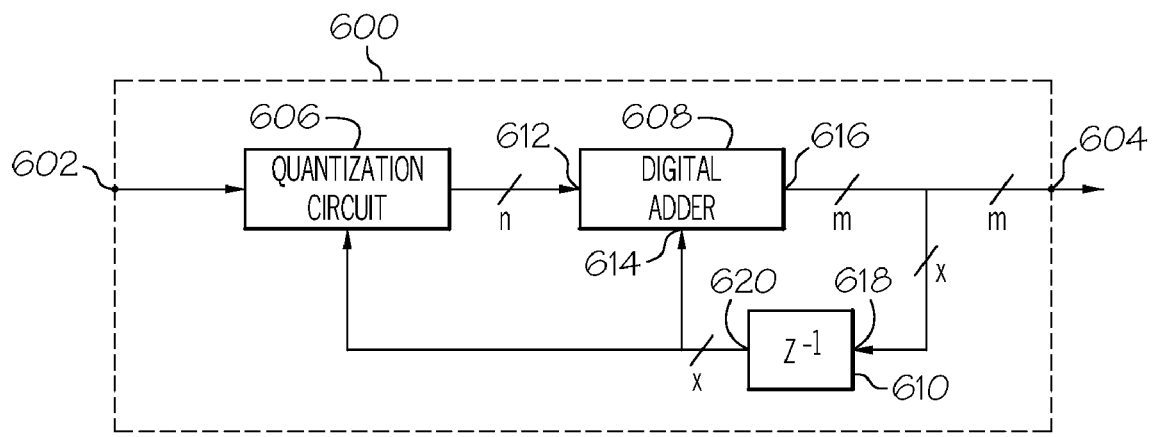
FIG. 6 is a block diagram of a quantizer suitable for use in the analog-to-digital converter of FIG. 1 in accordance with one embodiment.

Referring now to FIG. 6, in accordance with one embodiment, a quantizer 600 suitable for use in the analog-to-digital converter 100 of FIG. 1 may include, without limitation, an input node 602 for receiving an analog input signal, a digital output 604, a quantization circuit 606, a digital adder 608, and a digital delay element 610. In this embodiment, the quantizer 600 is self-adjusting, that is, the quantizer 600 is configured to automatically adjust the threshold voltage for one or more comparators utilized in the quantization circuit 606 in response to the digital value at the digital output 604, as described in greater detail below. As a result, the effective number of bits of the quantizer 600 can be increased (or maintained) while reducing the complexity, size, and current drawn by the analog circuit components needed in the quantization circuit 606. In this regard, in an exemplary embodiment, the quantizer 600 is configured to produce an m-bit digital output value at the digital output 604 using a quantization circuit 606 configured for n-bit operation.

In an exemplary embodiment, the input node of the quantization circuit 606 (e.g., input node 202) is connected to the analog input node 602 of the quantizer 600. The output of the quantization circuit 606 (e.g., the encoder output 218) is connected to a first summing input 612 of the digital adder 608. The digital adder 608 is configured to add the n bits at the first summing input 612 with x bits at a second summing input 614 of the digital adder 608 to produce an m-bit output at the summation output 616 of the digital adder 608. The m-bit digital value from the digital adder 608 is then provided to the digital output 604 of the quantizer 600. In an exemplary embodiment, a portion of bits the m-bit output of the digital adder 608 is used to create a feedback control loop. In this regard, the upper x number of bits of the m-bit output provided to the input 618 of the digital delay element 610. The digital delay element 610 is configured to delay the x-bits at its input 618 by a sampling interval (e.g., one sample), and produce x-bits at its output 620 representing the x-bits at the input 618 delayed by the sampling interval. Depending on the embodiment, the digital delay element 610 may be realized as a plurality of flip-flops (e.g., x number of flip-flops), a latch circuit, or another suitable digital delay element. The output 620 of the digital delay element 610 is coupled to the control node (e.g., control node 208) of the quantization circuit 606 and the second summing input 614 of the digital adder 608.

In an exemplary embodiment, the quantization circuit 606 is configured for $2^x$ operating modes. As the value of the analog input signal at the input node 602 fluctuates, the n-bit output of the quantization circuit 606 fluctuates, thereby producing a change in the m-bit output, which in turn affects the x-bits being used to control the operating mode of the quantization circuit 606. For example, assuming an initial state of the quantizer 600 where all the digital values throughout the system are zero, as the value of the input signal at the input node 602 increases, the output of the quantization circuit 606 produces a corresponding increase. Once the output of the quantization circuit 606 nears full-scale (e.g., each bit of the n-bits is a logical '1'), the x bits are configured to increase the threshold voltage for one or more comparators of the quantization circuit 606 (e.g., by adjusting the variable resistance elements 222, 224), thereby allowing the quantization circuit 606 to effectively resolve a larger analog input signal at the input node 602. In an exemplary embodiment, the threshold voltage for each comparator of the comparator array is increased uniformly, that is, the voltage resolution for the quantization circuit 606 remains the same but the threshold voltages for each respective comparator are increased by some DC value.

Conversely, as the analog input signal at the input node 602 decreases, the quantization circuit 606 produces a corresponding decrease in its digital output value. This results in a corresponding decrease in the m-bit digital output value at the output 616 of the digital adder 616, which produces a corresponding change in the value of the upper x bits. As the x bits respond to the changing digital output value, the threshold voltages for the comparators in the quantization circuit 606 are decreased (e.g., by adjusting the variable resistance elements 222, 224), thereby allowing the quantization circuit 606 to resolve a smaller analog input signal at the input node 602 with the desired precision. In this manner, the threshold voltages used to generate the n-bit output may be adjusted to accommodate the input signal level. In other words, the quantizer 600 and/or quantization circuit 606 adapts to changes to the level of the analog input signal. It should be appreciated in the art that the quantizer 600 of FIG. 6 may be utilized in the analog-to-digital converter 100 of FIG. 1 to adjust the quantizer 106 for the signal level at the input node 102, rather than utilizing variable gain amplifiers and other components that adjust the analog input signal level to accommodate the quantizer, which would otherwise result in increased power consumption and area required for the ADC 100. It should also be appreciated that because the quantizer 600 is self-adjusting, that, in some embodiments, the analog-to-digital converter 100 of FIG. 1 may be implemented without inclusion of control module 108 or alternatively, in conjunction with the control module 108.

One advantage of the systems and/or methods described above is that quantizer and/or quantization circuit may be used to realize an analog-to-digital converter configured to support multiple operating modes and/or communications standards using a single quantizer and/or quantization circuit. By adjusting the threshold voltage for one or more comparators used in converting an analog signal to a digital value, the voltage resolution and/or voltage range of the quantizer and/or quantization circuit may be adjusted to accommodate different input signal voltage ranges. Furthermore, the quantizer and/or quantization circuit may be configured in a manner that increases the effective number of bits of the analog-to-digital converter without significantly increasing the size, complexity, or current drawn by the analog circuit components.

In summary, systems, devices, and methods configured in accordance with example embodiments of the subject matter relate to:

An apparatus is provided for a quantization circuit in accordance with one embodiment. The quantization circuit comprises an input node for an input signal and a comparator array, wherein each comparator of the comparator array is coupled to the input node. A voltage divider arrangement is coupled to the comparator array and configured to establish a respective threshold voltage for each comparator of the comparator array. The comparator array generates a digital code based on the input signal and the respective threshold voltage for each comparator. A control node is coupled to the voltage divider arrangement, wherein the control node and the voltage divider arrangement are cooperatively configured to adjust the threshold voltage for at least one comparator of the comparator array in response to a control signal at the control node.

In accordance with one embodiment, the voltage divider arrangement comprises a voltage divider coupled to the comparator array and a first variable resistance element coupled to the voltage divider. The first variable resistance element is coupled to the control node, wherein the control node and the voltage divider arrangement are cooperatively configured to adjust the threshold voltage for the at least one comparator of the comparator array by adjusting the effective resistance of the first variable resistance element in response to the control signal. In a further embodiment, the first variable resistance element comprises: a first resistance element coupled between a first node and the voltage divider, a switch coupled to the first node, and a second resistance element coupled between the switch and the voltage divider, such that the second resistance element and the first resistance element are configured electrically in parallel when the switch is closed. In yet another embodiment, the control node and the first variable resistance element are cooperatively configured to adjust the effective resistance of the first variable resistance element by activating the switch in response to the control signal. In another embodiment, the control node and the first variable resistance element are cooperatively configured to decrease the effective resistance of the first variable resistance element by closing the switch in response to the control signal. In yet another embodiment, the control node and the first variable resistance element are cooperatively configured to increase the effective resistance of the first variable resistance element by opening the switch in response to the control signal.

In accordance with one embodiment, the voltage divider arrangement further comprises a second variable resistance element coupled to the voltage divider. The second variable resistance element is coupled to the control node, wherein the voltage divider arrangement and the control node are cooperatively configured to adjust the effective resistance of the second variable resistance element in response to the control signal. In another embodiment, the quantization circuit further comprises a first reference node, wherein the first variable resistance element is coupled between the first reference node and the voltage divider, and a second reference node, wherein the second variable resistance element is coupled between the second reference node and the voltage divider. In accordance with another embodiment, an encoder is coupled to the comparator array and configured to produce a digital value based on the digital code. In accordance with yet another embodiment, the quantization circuit further comprises a digital adder having a first summing input, a second summing input, and a summation output, wherein the first summing input is coupled to the encoder and receives the digital value and the summation output is configured to produce a plurality of bits by adding the digital value and a feedback value at the second summing input. A digital delay element is coupled to the summation output, the second summing input, and the control node, wherein the digital delay element is configured to delay a first portion of bits of the plurality of bits at the summation output to obtain the feedback value, wherein the feedback value is provided to the second summing input and the threshold voltage for the at least one comparator of the comparator array is adjusted based on the feedback value.

In accordance with one exemplary embodiment, an apparatus for an analog-to-digital converter is provided. The analog-to-digital converter comprises an input node for receiving an input signal, a control node for receiving a control signal, a digital output, and a quantizer coupled between the input node and the digital output. The quantizer is configured to generate a digital code based at least in part on the input signal and a respective threshold voltage for a comparator, wherein the quantizer is coupled to the control node and configured to generate a digital value at the digital output based on the digital code and adjust the respective threshold voltage for the comparator in response to the control signal. In an exemplary embodiment, the quantizer comprises a plurality of comparators configured to generate a thermometer code based at least in part on the input signal and a respective threshold voltage for each comparator of the plurality of comparators, wherein the quantizer is configured to generate the digital value based on the thermometer code and adjust the respective threshold voltage for at least one comparator of the plurality of comparators in response to the control signal.

In accordance with one embodiment, the analog-to-digital converter further comprises a forward signal arrangement coupled between the input node and the quantizer. The forward signal arrangement is configured to produce a first analog signal based at least in part on the input signal, wherein the plurality of comparators generates the thermometer code based on the first analog signal. In another embodiment, the analog-to-digital converter further comprises a digital-to-analog converter coupled between the digital output and the forward signal arrangement. The digital-to-analog converter is configured to convert the digital value to an analog feedback signal, wherein the forward signal arrangement produces the first analog signal based on the input signal and the analog feedback signal. In yet another embodiment, the quantizer is configured to generate the thermometer code using a first voltage resolution for a first operating mode and generate the thermometer code using a second voltage resolution for a second operating mode. In one embodiment, the analog-to-digital converter further comprises a control module coupled to the control node, wherein the control module is configured to identify the second operating mode and adjust the threshold voltage for at least one comparator of the plurality of comparators in response to identifying the second operating mode. In yet another embodiment, the quantizer further comprises a voltage divider coupled to the plurality of comparators and configured to establish the respective threshold voltage for each comparator of the plurality of comparators and a first variable resistance element coupled to the voltage divider. The first variable resistance element is coupled to the control module, wherein the control module is configured to adjust the effective resistance of the first variable resistance element in response to identifying the second operating mode.

In another embodiment, a method is provided for converting an analog input signal at an input node of a quantization circuit to a digital output value. The method comprises generating a digital code using a comparator array configured for a first operating mode, wherein the digital code is based on the analog input signal and a respective threshold voltage for each comparator of the comparator array in the first operating mode. The method further comprises identifying a second operating mode, adjusting the threshold voltage for at least one comparator of the comparator array in response to identifying the second operating mode, and generating the digital output value based on the digital code. In accordance with one embodiment, generating the digital code comprises generating a thermometer code based on the analog input signal using a first voltage resolution in the first operating mode, and generating the thermometer code based on the analog input signal using a second voltage resolution in the second operating mode in response to adjusting the threshold voltage for at least one comparator of the comparator array. In yet another embodiment, the quantization circuit comprises a voltage divider arrangement coupled to the comparator array, wherein the voltage divider arrangement is configured to establish the respective threshold voltage for each comparator of the comparator array. The voltage divider arrangement includes a variable resistance element, wherein adjusting the respective threshold voltage for the at least one comparator of the comparator array comprises adjusting the effective resistance of the variable resistance element in response to identifying the second operating mode.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A quantization circuit comprising:
    an input node for an input signal;
    a comparator array coupled to the input node, wherein each comparator of the comparator array is coupled to the input node;
    a voltage divider arrangement coupled to the comparator array, the voltage divider arrangement having a plurality of threshold voltage reference nodes, each threshold voltage reference node being configured to establish a respective threshold voltage for each comparator of the comparator array, wherein a voltage potential difference between adjacent threshold reference nodes is substantially equal throughout the voltage divider, and wherein the comparator array generates a digital code based on the input signal and the respective threshold voltage for each comparator; and
    a control node coupled to the voltage divider arrangement, wherein the control node and the voltage divider arrangement are cooperatively configured to adjust the voltage potential difference between adjacent threshold voltage reference nodes by adjusting the threshold voltage for at least one comparator of the comparator array in response to a control signal at the control node.

2. The quantization circuit of claim 1, wherein the voltage divider arrangement comprises:
    a voltage divider coupled to the comparator array; and
    a first variable resistance element coupled to the voltage divider, the first variable resistance element being coupled to the control node, wherein the control node and the voltage divider arrangement are cooperatively configured to adjust the threshold voltage for the at least one comparator of the comparator array by adjusting the effective resistance of the first variable resistance element in response to the control signal.

3. The quantization circuit of claim 2, wherein the first variable resistance element comprises:
    a first resistance element coupled between a first node and the voltage divider;
    a switch coupled to the first node; and
    a second resistance element coupled between the switch and the voltage divider, such that the second resistance element and the first resistance element are configured electrically in parallel when the switch is closed.

4. The quantization circuit of claim 3, wherein the control node and the first variable resistance element are cooperatively configured to adjust the effective resistance of the first variable resistance element by activating the switch in response to the control signal.

5. The quantization circuit of claim 4, wherein the control node and the first variable resistance element are cooperatively configured to decrease the effective resistance of the first variable resistance element by closing the switch in response to the control signal.

6. The quantization circuit of claim 4, wherein the control node and the first variable resistance element are cooperatively configured to increase the effective resistance of the first variable resistance element by opening the switch in response to the control signal.

7. The quantization circuit of claim 2, wherein the voltage divider arrangement further comprises:
    a second variable resistance element coupled to the voltage divider, the second variable resistance element being coupled to the control node, wherein the voltage divider arrangement and the control node are cooperatively configured to adjust the effective resistance of the second variable resistance element in response to the control signal.

8. The quantization circuit of claim 7, further comprising:
    a first reference node, the first variable resistance element being coupled between the first reference node and the voltage divider; and
    a second reference node, the second variable resistance element being coupled between the second reference node and the voltage divider.

9. The quantization circuit of claim 1, further comprising an encoder coupled to the comparator array, wherein the encoder is configured to produce a digital value based on the digital code.

10. The quantization circuit of claim 9, further comprising:
    a digital adder having a first summing input, a second summing input, and a summation output, wherein:
        the first summing input is coupled to the encoder and receives the digital value; and
        the summation output is configured to produce a plurality of bits by adding the digital value and a feedback value at the second summing input; and
    a digital delay element coupled to the summation output, the second summing input, and the control node, wherein the digital delay element is configured to delay a first portion of bits of the plurality of bits at the summation output to obtain the feedback value, wherein the feedback value is provided to the second summing input and the threshold voltage for the at least one comparator of the comparator array is adjusted based on the feedback value.

11. An analog-to-digital converter comprising:
an input node for receiving an input signal;
a control node for receiving a control signal;
a digital output; and
a quantizer coupled between the input node and the digital output, the quantizer being configured to generate a digital code with a first voltage resolution based at least in part on the input signal and a respective threshold voltage for a comparator, wherein the quantizer is coupled to the control node and configured to:
generate a digital value at the digital output based on the digital code; and
generate the digital code with a second voltage resolution by adjusting the respective threshold voltage for the comparator in response to the control signal.

12. The analog-to-digital converter of claim 11, wherein the quantizer comprises a plurality of comparators configured to generate a thermometer code with the first voltage resolution based at least in part on the input signal and a respective threshold voltage for each comparator of the plurality of comparators, and wherein the quantizer is configured to:
generate the digital value based on the thermometer code; and
adjust the respective threshold voltage for at least one comparator of the plurality of comparators in response to the control signal, the plurality of comparators generating the thermometer code with the second voltage resolution in response to adjusting the respective threshold voltage for at least one comparator of the plurality of comparators.

13. The analog-to-digital converter of claim 12, further comprising a forward signal arrangement coupled between the input node and the quantizer, the forward signal arrangement being configured to produce a first analog signal based at least in part on the input signal, wherein the plurality of comparators generates the thermometer code based on the first analog signal.

14. The analog-to-digital converter of claim 13, further comprising a digital-to-analog converter coupled between the digital output and the forward signal arrangement, the digital-to-analog converter being configured to convert the digital value to an analog feedback signal, wherein the forward signal arrangement produces the first analog signal based on the input signal and the analog feedback signal.

15. The analog-to-digital converter of claim 12, wherein the quantizer is configured to:
generate the thermometer code using the first voltage resolution for a first operating mode; and
generate the thermometer code using the second voltage resolution for a second operating mode.

16. The analog-to-digital converter of claim 15, further comprising a control module coupled to the control node, the control module being configured to:
identify the second operating mode; and
adjust the threshold voltage for at least one comparator of the plurality of comparators in response to identifying the second operating mode.

17. The analog-to-digital converter of claim 16, wherein the quantizer further comprises:
a voltage divider coupled to the plurality of comparators and configured to establish the respective threshold voltage for each comparator of the plurality of comparators; and
a first variable resistance element coupled to the voltage divider, the first variable resistance element being coupled to the control module, wherein the control module is configured to adjust the effective resistance of the first variable resistance element in response to identifying the second operating mode.

18. A method for converting an analog input signal at an input node of a quantization circuit to a digital output value, the method comprising:
generating a digital code using a comparator array configured for a first operating mode, wherein the digital code is based on the analog input signal and a respective threshold voltage for each comparator of the comparator array, the threshold voltage for the comparators of the comparator array corresponding to a first voltage resolution in the first operating mode;
identifying a second operating mode;
adjusting, in response to identifying the second operating mode, the threshold voltage for at least one comparator of the comparator array;
generating the digital code having a second voltage resolution in response to adjusting the threshold voltage for at least one comparator array; and
generating the digital output value based on the digital code.

19. The method of claim 18, wherein the generating the digital code comprises:
generating a thermometer code based on the analog input signal using the first voltage resolution in the first operating mode; and
generating the thermometer code based on the analog input signal using the second voltage resolution in response to adjusting the threshold voltage for at least one comparator of the comparator array.

20. The method of claim 18, the quantization circuit comprising a voltage divider arrangement coupled to the comparator array, the voltage divider arrangement being configured to establish the respective threshold voltage for each comparator of the comparator array, the voltage divider arrangement including a variable resistance element, wherein adjusting the respective threshold voltage for the at least one comparator of the comparator array comprises adjusting the effective resistance of the variable resistance element in response to identifying the second operating mode.

21. A quantization circuit comprising:
an input node for an input signal;
a comparator array coupled to the input node, wherein each comparator of the comparator array is coupled to the input node;
a voltage divider arrangement coupled to the comparator array and configured to establish a respective threshold voltage for each comparator of the comparator array, wherein the comparator array generates a digital code based on the input signal and the respective threshold voltage for each comparator;
a control node coupled to the voltage divider arrangement, wherein the control node and the voltage divider arrangement are cooperatively configured to adjust the threshold voltage for at least one comparator of the comparator array in response to a control signal at the control node;
an encoder coupled to the comparator array, wherein the encoder is configured to produce a digital value based on the digital code;
a digital adder having a first summing input, a second summing input, and a summation output, wherein:
the first summing input is coupled to the encoder and receives the digital value; and
the summation output is configured to produce a plurality of bits by adding the digital value and a feedback value at the second summing input; and a digital delay element coupled to the summation output, the second summing input, and the control node, wherein the digital delay element is configured to delay a first portion of bits of the plurality of bits at the summation output to obtain the feedback value, wherein the feedback value is provided to the second summing input and the threshold voltage for the at least one comparator of the comparator array is adjusted based on the feedback value.

* * * * *